(12) United States Patent
Gotou

(10) Patent No.: US 8,410,640 B2
(45) Date of Patent: Apr. 2, 2013

(54) ELECTRIC POWER CONVERTER

(75) Inventor: Yukio Gotou, Chiryu (JP)

(73) Assignee: Denso Corporation, Kariya (JP)

( * ) Notice: Subject to any disclaimer, the term of this patent is extended or adjusted under 35 U.S.C. 154(b) by 300 days.

(21) Appl. No.: 12/824,561

(22) Filed: Jun. 28, 2010

(65) Prior Publication Data

US 2010/0327949 A1    Dec. 30, 2010

(30) Foreign Application Priority Data

Jun. 29, 2009 (JP) .................................. 2009-153145

(51) Int. Cl.
*H01B 5/00* (2006.01)
*H02G 5/00* (2006.01)
(52) U.S. Cl. ........................................................ 307/147
(58) Field of Classification Search .................... 307/147
See application file for complete search history.

(56) References Cited

FOREIGN PATENT DOCUMENTS

| JP | 2006-295997 | 10/2006 |
|---|---|---|
| JP | 2008-253055 | 10/2008 |

*Primary Examiner* — Adi Amrany
(74) *Attorney, Agent, or Firm* — Nixon & Vanderhye PC

(57) ABSTRACT

An electric power converter has a semiconductor module and a capacitor. The positive side semiconductor module has a positive terminal and the 1st intermediate terminal while the negative side semiconductor module has a negative terminal and the 2nd intermediate terminal. These terminals are formed in projected forms. The positive terminal and the negative terminal are connected to the capacitor by a positive bus bar and a negative bus bar, respectively. The 1st intermediate terminal and the 2nd intermediate terminal are connected each other by an intermediate bus bar. The positive and the negative side semiconductor modules, the capacitor, the positive, the negative and the intermediate bus bars constitute one closed circuit. The direction of the each current that flows to each of the main part portion, the positive, the negative and the intermediate bus bars opposes the neighboring current when a closed current flows in the closed circuit.

4 Claims, 6 Drawing Sheets

ELECTRIC POWER CONVERTER

CROSS-REFERENCE TO RELATED APPLICATION

This application is based on and claims the benefit of priority from earlier Japanese Patent Application No. 2009-153145 filed Jun. 29, 2009, the description of which is incorporated herein by reference.

BACKGROUND OF THE INVENTION

1. Technical Field of the Invention

The present invention relates to an electric power converter that has a plurality of semiconductor modules having integral semiconductor elements and a capacitor as a power source connected to the semiconductor modules.

2. Description of the Related Art

Electric power converters such as an inverter and a converter convert electric power by switching a plurality of semiconductor elements (switching elements).

There exist high-voltage-side semiconductor elements and low-voltage-side semiconductor elements connected mutually, A capacitor, which serves as a power source, is connected to electrode terminals of the semiconductor elements opposite to the sides where the semiconductor elements are connected mutually. In addition, the semiconductor elements and the capacitor are connected by bus bars.

Thereby, one closed circuit is formed with the pair of semiconductor elements, the capacitor, and the plurality of bus bars.

Further, the current that flows to the closed circuit changes when switching the semiconductor elements (refer to the first embodiment, FIG. 11 and FIG. 12 of Japanese Patent Application Laid-Open Publication No. 2008-253055).

When the impedance in the closed circuit is high at this time, a large surge voltage arises and there is a possibility of causing damage to the semiconductor elements.

Then, the technology of reducing the inductance in the above-mentioned closed circuit by making an area inside a closed circuit small is disclosed in Japanese Patent Application Laid-Open Publications No. 2002-253055 and No. 2006-2959 97.

However, if the circuit has the composition that the current flows mutually in the same direction in parts of conductive parts adjoining the closed circuits, the inductance of the parts will become large even if the area inside the closed circuit is made small.

Consequently, there is a possibility that it may become difficult to fully control the surge voltage.

SUMMARY OF THE INVENTION

The present invention has been made in order to solve the issue described above, and has as its object to provide an electric power converter that reduces an inductance in a circuit.

In an electric power converter according to a first aspect, the electric power converter includes a plurality of semiconductor modules having integral semiconductor elements and a capacitor as a power source connected to the semiconductor modules.

The semiconductor modules includes a positive side semiconductor module connected to a positive side of the capacitor and a negative side semiconductor module connected to a negative side of the capacitor.

The positive side semiconductor module has a positive terminal connected to the capacitor and the 1st intermediate terminal connected to the negative side semiconductor module where both terminals are formed in projected forms, while the negative side semiconductor module has a negative terminal connected to the capacitor and the 2nd intermediate terminal connected to the positive side semiconductor module where both terminals are formed in projected forms.

The positive terminal is connected to the capacitor by a positive bus bar, the negative terminal is connected to the capacitor by a negative bus bar, the 1st intermediate terminal and the 2nd intermediate terminal are connected to each other by an intermediate bus bar, and the positive side semiconductor module, the negative side semiconductor module, the capacitor, the positive bus bar, the negative bus bar, and the intermediate bus bar constitute one closed circuit.

A main part portion of the semiconductor module, the positive bus bar, the negative bus bar, and the intermediate bus bar are arranged in laminated forms so that the direction of the each current that flows to each of the main part portion, the positive bus bar, the negative bus bar, and the intermediate bus bar opposes the neighboring current when a closed current flows in the closed circuit.

In the above-mentioned electric power converter, the main part portion of the semiconductor module, the positive bus bar, the negative bus bar, and the intermediate bus bar are arranged in laminated forms so that the direction of the each current that flows to each of the main part portion, the positive bus bar, the negative bus bar, and the intermediate bus bar opposes the neighboring current when a closed current flows in the closed circuit.

Thereby, the inductance in the closed circuit can be reduced.

That is, the current that flows in the circuit in the electric power converter including the closed circuit, the way of flowing and the size of the current change when switching the semiconductor elements can be reduced.

When an attention is paid to the above-mentioned closed circuit at this time, the size and the direction of the closed current that flows in this closed circuit will change.

If a part of a conductive portion that adjoins the above-mentioned closed circuits has a composition such that the current flows in the mutually same direction, the inductance of the portion will become large as mentioned above.

On the contrary, the inductance of the portion can be reduced by reversing the direction of the current in the adjoining conductive portion.

The inductance of the closed circuit then can be reduced by arranging each conductive part in laminated form so that the direction of each current that flows to each of the main part portion, the positive bus bar, the negative bus bar, and the intermediate bus bar opposes the neighboring current.

As a result, generation of the surge voltage at the time of the switching of the semiconductor elements can be suppressed.

According to the present invention, the electric power converter with reduced inductance can be obtained as mentioned above.

In the present invention, the above-mentioned electric power converter can be used as an inverter provided for an electric car, a hybrid car, etc.

In an electric power converter according to a second aspect, the positive side semiconductor module and the negative side semiconductor module are arranged in parallel so that the positive terminal and the negative terminal adjoin each other.

The capacitor is arranged in one side of the negative side semiconductor module that is the position opposite to the side where the positive side semiconductor module is arranged.

It is preferred that the intermediate bus bar, the positive bus bar, and the negative bus bar are arranged in this order so that a distance from the bus bars to the main part portion of the semiconductor module is small.

In an electric power converter according to a third aspect, the positive side semiconductor module and the negative side semiconductor module are arranged in parallel so that the positive terminal and the negative terminal adjoin each other.

The capacitor is arranged in one side of the positive side semiconductor module that is the position opposite to the side where the negative side semiconductor module is arranged.

It is preferred that the intermediate bus bar, the negative bus bar, and the positive bus bar are arranged in this order so that a distance from the bus bars to the main part portion of the semiconductor module is small.

DETAILED DESCRIPTION OF PREFERRED EMBODIMENTS

First Embodiment

Art electric power converter regarding a first embodiment of the present invention is explained using FIGS. 1-4.

Figure 1:
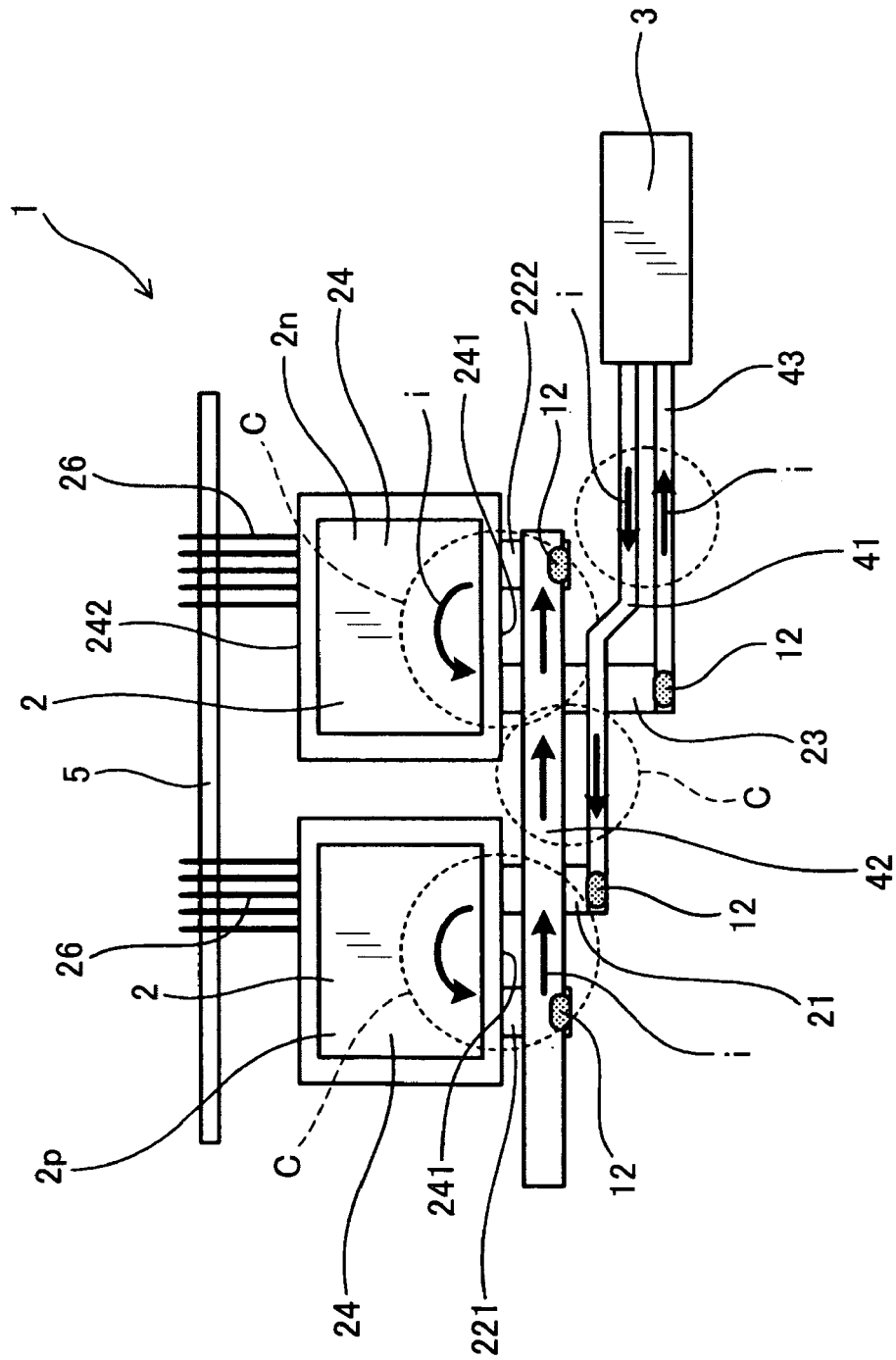
FIG. 1 is a side view showing an electric power converter in a first embodiment.
Figure 2:
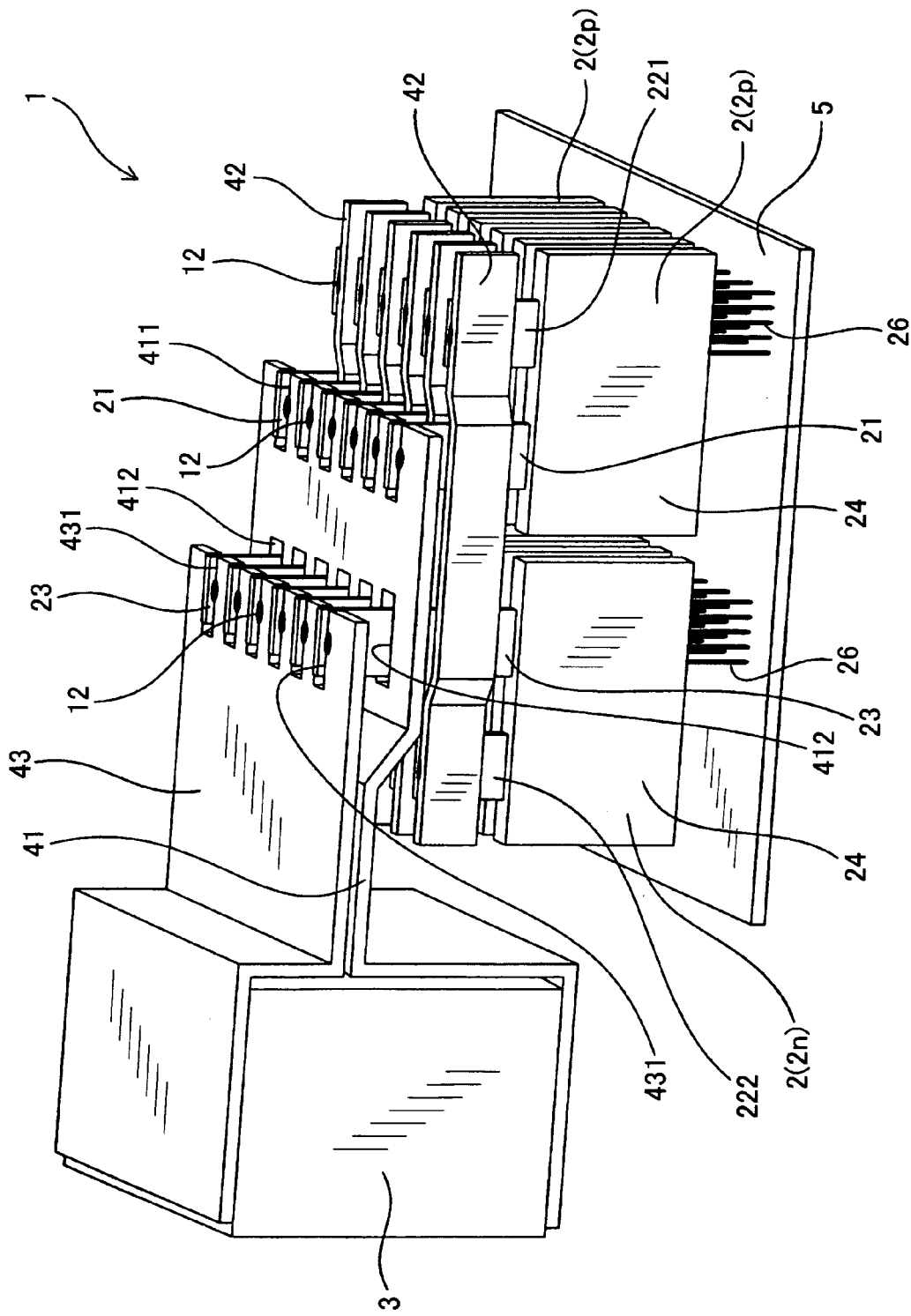
FIG. 2 is a perspective view showing the electric power converter in the first embodiment.

As shown in FIG. 1 and FIG. 2, an electric power converter 1 of the present embodiment has a plurality of semiconductor modules 2, each having semiconductor elements integrally, and a capacitor 3 used as a power source connected to the semiconductor modules 2.

There exist a positive side semiconductor module 2p connected to a positive side of the capacitor 3 and a negative side semiconductor module 2n connected to a negative side of the capacitor 3 in the above-mentioned semiconductor modules 2.

The positive side semiconductor module 2p has a positive terminal 21 connected to the capacitor 3 and the 1st intermediate terminal 221 connected to the negative side semiconductor module 2n. Both terminals 21 and 221 are formed in projected forms.

The negative side semiconductor module 2n has a negative terminal 23 connected to the capacitor 3 and the 2nd intermediate terminal 222 connected to the positive side semiconductor module 2p. Both terminals 23 and 222 are formed in projected forms.

The positive terminal 21 is connected to the capacitor 3 by a positive bus bar 41, while the negative terminal 23 is connected to the capacitor 3 by a negative bus bar 43. Moreover, the 1st intermediate terminal 221 and the 2nd intermediate terminal 222 are connected each other by an intermediate bus bar 42.

As shown in FIG. 1, the positive side semiconductor module 2p, the negative side semiconductor module 2n, the capacitor 3, the positive bus bar 41, the negative bus bar 43, and the intermediate bus bar 42 constitute one closed circuit.

The main part portion 24 of the semiconductor module 2, the positive bus bar 41, the negative bus bar 43, and the intermediate bus bar 42 are arranged in laminated forms so that the direction of the each current i that flows to each of the main part portion 24, the positive bus bar 41, the negative bus bar 43, and the intermediate bus bar 42 opposes the neighboring current when a closed current flows in the closed circuit (refer to the inside of the dashed line circle C in FIG. 1).

Specifically, in the present embodiment, as shown in FIG. 1 and FIG. 2, the positive side semiconductor module 2p and the negative side semiconductor module 2n are arranged in parallel so that the positive terminal 21 and the negative terminal 23 may adjoin each other.

In addition, the capacitor 3 is arranged in one side of the negative side semiconductor module 2n that is the position opposite to the side where the positive side semiconductor module 2p is arranged.

Further, the intermediate bus bar 42, the positive bus bar 41, and the negative bus bar 43 are arranged in this order so that a distance from the bus bars to the main part portion 24 of the semiconductor module 2 is small.

The semiconductor module 2 integrates semiconductor elements, such as IGBT, inside the main part portion 24, and a flywheel diode connected in reverse parallel to the semiconductor elements.

A plurality of control terminals 26 are formed in projected forms from one edge side 242 in the main part portion 24. The control terminals 26 are connected to the control circuit board 5 that controls the semiconductor element.

In the positive side semiconductor module 2p, the above-mentioned positive terminal 21 and the 1st intermediate terminal 221 are formed in projected forms from an edge side 241 opposing the control terminals 26 in the main part portion 24.

In the negative side semiconductor module 2n, the above-mentioned negative terminal 23 and the 2nd intermediate terminal 222 are formed in projected forms from an edge side 241 opposing the control terminals 26 in the main part portion 24.

As shown in FIG. 2, the electric power converter 1 has a plurality of positive side semiconductor modules 2p and a plurality of negative side semiconductor modules 2n. The positive side semiconductor module 2p and the negative side semiconductor module 2n are arranged in laminated manner in their thickness direction.

At this time, each of the control terminals 26, the positive terminals 21, the negative terminals 23, the 1st intermediate terminals 221, and the 2nd intermediate terminals 222 are projected in the same direction while these terminals are arranged in a row.

The positive terminals 21 of the plurality of positive side semiconductor modules 2p are connected to one common positive bus bar 41, and the negative terminals 23 of the plurality of negative side semiconductor modules 2n are connected to one common negative bus bar 43.

On the other hand, the 1st intermediate terminals 221 of the positive side semiconductor modules 2p and the 2nd intermediate terminals 222 of the negative side semiconductor modules 2n are connected to the intermediate bus bar 42 individually by a set.

The intermediate bus bar 42 is suitably connected to an electrode of an electric rotary machine (not shown) of the three-phase alternating current that the electric power converter 1 of the present embodiment drives.

Each end of the positive bus bar 41 and the negative bus bar 43 is connected to a positive terminal and a negative terminal of the capacitor 3.

A plurality of slits 411 and 431 are formed in each other ends of the positive bus bar 41 and the negative bus bar 43, and the positive terminals 21 and the negative terminals 23 of the semiconductor modules 2 are inserted in these slits 411 and 431, respectively. The positive terminals 21 and the negative terminals 23 are welded to the positive bus bar 41 and the negative bus bar 43. Reference numbers 12 in FIG. 1 and FIG. 2 denote welding parts.

A plurality of penetration holes 412 are formed in the positive bus bar 41, and the negative terminals 23 of the semiconductor module 2 are inserted in these penetration holes 412.

Thereby, the negative terminals 23 are electrically connected to the negative bus bar 43 without contacting the positive bus bar 41 electrically.

As shown in FIG. 1 and FIG. 2, the 1st intermediate terminals 221 and the 2nd intermediate terminal 222s are shorter than the positive terminals 21 and the negative terminals 23, and the positive terminals 21 are shorter than the negative terminals 23.

The intermediate bus bars 42 are welded to the tip parts of the 1st intermediate terminals 221 and the tip parts of the 2nd intermediate terminals 222.

One end of the positive bus bar 41 is welded to the tip parts of the positive terminals 21, and one end of the negative bus bar 43 is welded to the tip parts of the negative terminals 23.

Thereby, the intermediate bus bars 42 are arranged parallel to the edge side 241 of the semiconductor modules 2 in the position nearest to the main part portion 24 of the semiconductor module 2.

The positive bus bar 41 adjoins the intermediate bus bars in parallel with the intermediate bus bars 42 in the longitudinal direction at the opposite side of the main part portion 24 of the semiconductor module 2.

Further, the negative bus bar 43 adjoins the positive bus bar 41 in parallel with the positive bus bar 41 at the opposite side of the main part portion 24 of the semiconductor module 2.

The interval between the edge side 241 of the semiconductor module 2 and the intermediate bus bar 42 may be 10 mm or less. The interval between the intermediate bus bar 42 and the positive bus bar 41 may be 1-10 mm. The interval between the positive bus bar 41 and the negative bus bar 43 may be 1-10 mm.

The positive bus bar 41 and the negative bus bar 43 may be fixed in laminated forms mutually with an insulating sheet intervened there between.

Next, an operation and effect of the present embodiment are explained.

In the above-mentioned electric power converter 1, the main part portion 24 of the semiconductor module 2, the positive bus bar 41, the negative bus bar 43, and the intermediate bus bar 42 are arranged in laminated forms so that the direction of the each current i that flows to each of the main part portion 24, the positive bus bar 41, the negative bus bar 43, and the intermediate bus bar 42 opposes the neighboring current when a closed current flows in the closed circuit.

Thereby, the inductance in the closed circuit can be reduced.

That is, the current that flows in the circuit in the electric power converter 1 including the closed circuit, the way of flowing and the size of the current change when switching the semiconductor elements.

When an attention is paid to the above-mentioned closed circuit at this time, the size and the direction of the closed current that flows in this closed circuit will change.

The current change In the closed circuit is explained concretely below.

Figure 3A:
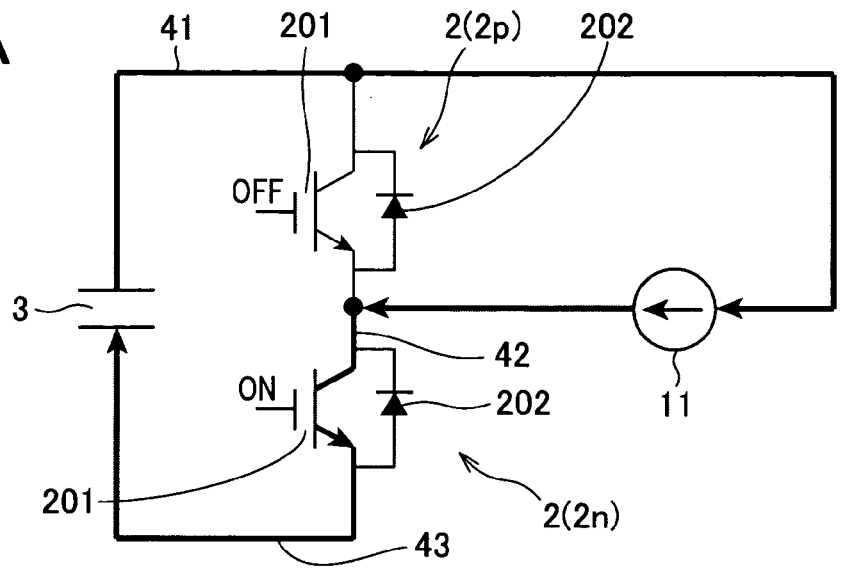
FIGS. 3A-3C are circuit diagrams explaining a current path before and after turning off a lower arm side semiconductor element.
Figure 3B:
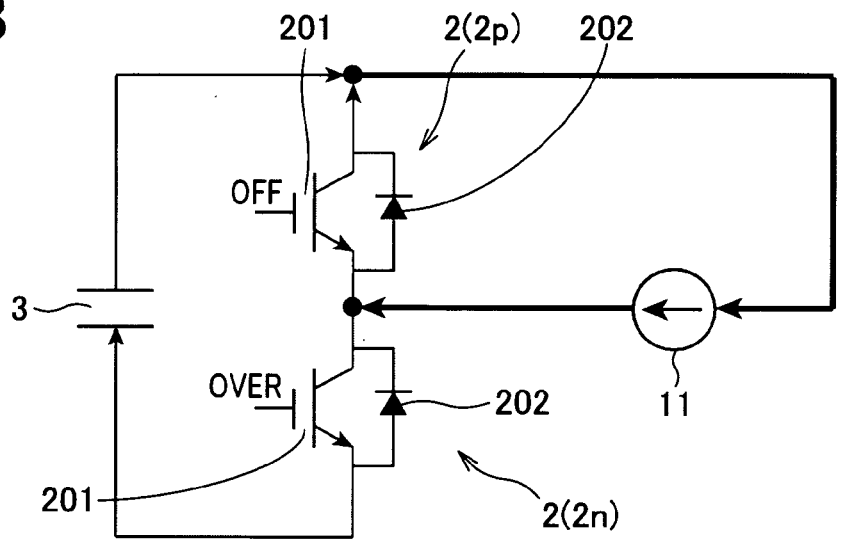
Figure 3C:
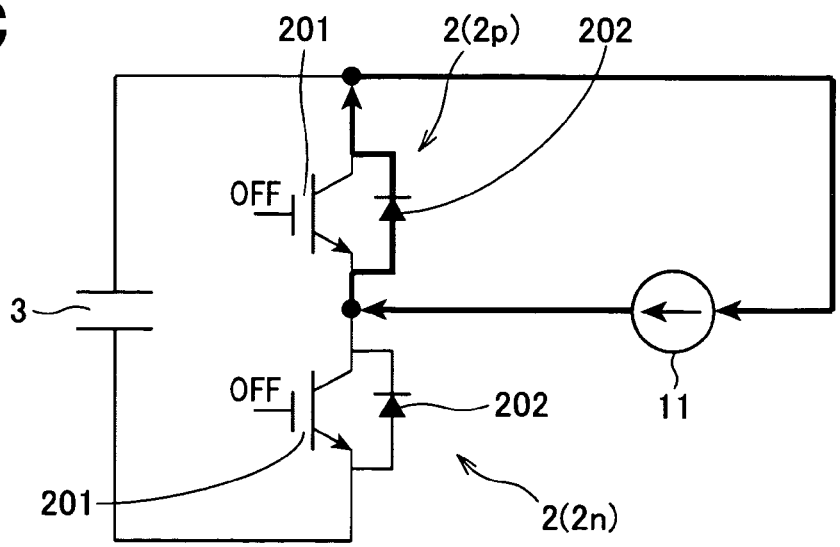

A circuit that corresponds to one phase of the motor in the electric power converter 1 can be expressed as shown in FIGS. 3A-3C.

It is considered hereafter that the current change produced when changing the semiconductor element 201 (a lower arm side semiconductor elements 201) of the negative side semiconductor module 2n from ON to OFF where the semiconductor element 201 (an upper arm side semiconductor elements 201) in the positive side semiconductor module 2p is set to OFF.

When the lower arm side semiconductor element 201 is ON, as shown in FIG. 3A, a current path passes along an inductor 11 from the positive side of the capacitor 3, passes along the lower arm side semiconductor elements 201, and turns into the path that returns to the negative side of the capacitor 3.

Here, the inductor 11 denotes an upper arm side semiconductor element of other phase of the motor in the electric power converter 1, i.e., the upper arm side semiconductor element different from the upper arm side semiconductor element 201 and motor windings.

Next, as shown in FIG. 3B, in the transition state of changing the lower arm side semiconductor element 201 from ON to OFF, both the same current path as the above and the current path from which the current that passed the inductor 11 returning to the positive terminal 23 side of the power module 2 through an upper arm side diode 202 are formed.

Further, as shown in FIG. 3C, after the lower arm side semiconductor element 201 has become completely OFF, a current will flow to the closed circuit that connects the upper arm side diode 202 and the inductor 11.

Because such a current change arises in sequence, high frequency current will flow in the circuit.

Among the three states here, when considering the average of the currents that flow in the lower arm side semiconductor elements 201 in the state of ON (FIG. 34) and in the state of OFF (FIG. 3C) to be a direct-current ingredient $I_{DC}$ that is flowing in the circuit without changing all the time, the difference of the current of each two states mentioned above (FIGS. 3A and 3C) over the direct-current ingredient $I_{DC}$ can be considered to be an alternate-current ingredient $I_{AC}$ that changes successively by the switching.

Thus, the current in each state is separable into the direct-current ingredient $I_{DC}$ and the alternate-current ingredient $I_{AC}$.

Figure 4A:
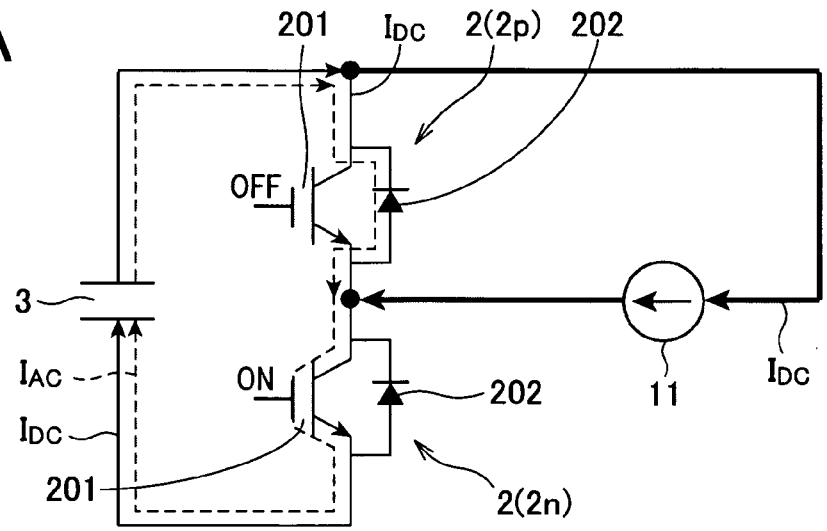
FIGS. 4A-4C are circuit diagrams that divided the current shown in FIG. 3 into a DC ingredient and an AC ingredient.
Figure 4B:
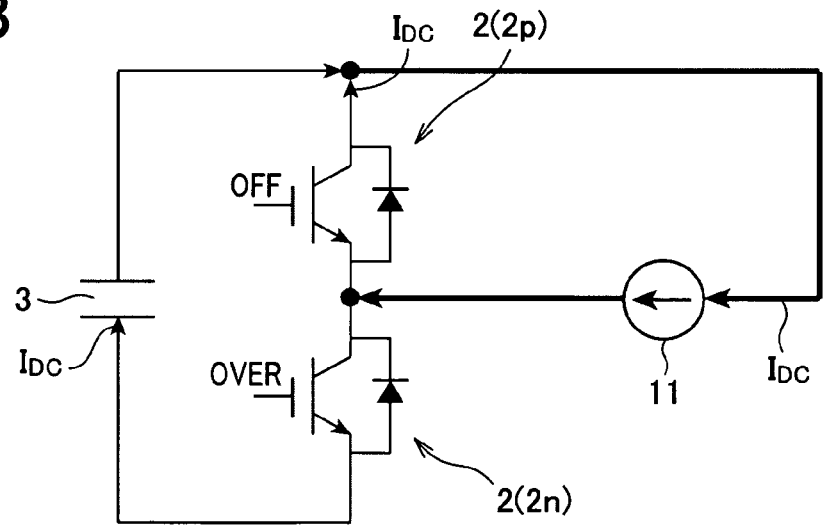
Figure 4C:
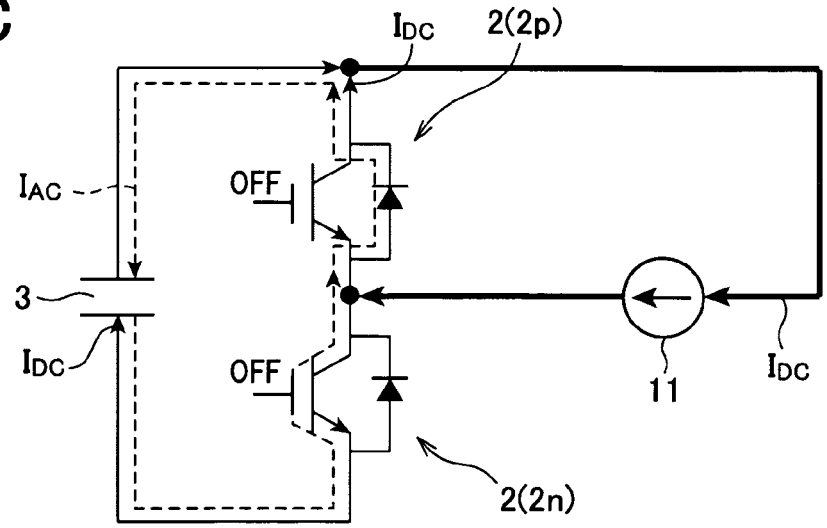

That is, as shown in FIG. 4, the alternate-current ingredient $I_{AC}$ flows to the dosed circuit that connects the capacitor 3, the upper arm side diode 202 and the lower arm side semiconductor elements 201. The flow of the alternate-current ingredient $I_{AC}$ when the lower arm side semiconductor element 201 is ON (FIG. 4A) and OFF (FIG. 4C) is opposed.

In another words, the direction of the alternate-current ingredient $I_{AC}$ will be reversed by changing the lower arm side semiconductor element 201 from ON to OFF.

A surge voltage V arises in the circuit with a large inductance by the change of the alternate-current ingredient $I_{AC}$, i.e., generation of the rate-of-current-change dl/dt.

Further, when a high frequency current flows in the circuit with the large inductance, i.e., when change arises in the size or direction of the current), a large surge voltage will arise.

That is, when the surge voltage is V, the inductance is L, and the rate-of-current-change is dl/dt, the surge voltage V will become large when the inductance L becomes large, since the surge voltage is obtained by V=−L (dI/dt). Therefore, it is necessary to reduce the inductance L.

If a part of conductive portion that adjoins in of the above-mentioned closed circuits has a composition of the current (alternate-current ingredient $I_{AC}$) that flows in the same direction mutually, the inductance of the portion will become large as mentioned above.

On the contrary, the inductance of the portion can be reduced by reversing the direction of the current (alternate-current ingredient $I_{AC}$) in the adjoining conductive portion.

The inductance of the closed circuit then can be reduced by arranging each conductive part in laminated forms so that the direction of the each current i that flows to each of the main part portion 24, the positive bus bar 41, the negative bus bar 43, and the intermediate bus bar 42 opposes the neighboring current, as shown in FIG. 1.

As a result, generation of the surge voltage at the time of the switching of the semiconductor elements can be suppressed.

According to the present embodiment, the electric power converter that reduces the inductance can be obtained as mentioned above.

Second Embodiment

Figure 5:
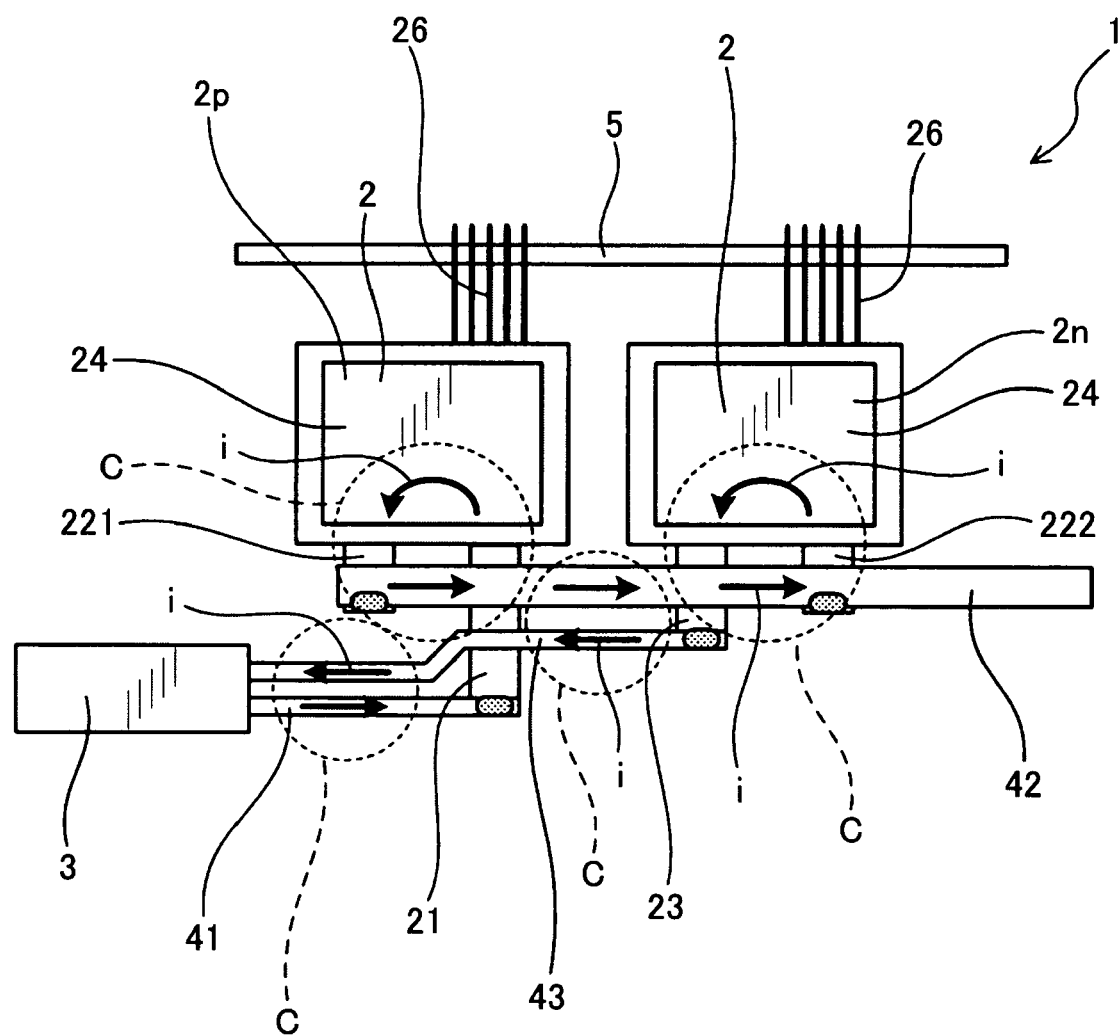
FIG. 5 is a side view showing an electric power converter in a second embodiment.

As in this second embodiment shown in FIG. 5, this is an example where the capacitor 3 is arranged in the position in the positive side semiconductor module 2p opposite to the side of the negative side semiconductor module 2n.

The intermediate bus bar 42, the negative bus bar 43, and the positive bus bar 41 are arranged in this order, in the state where distance to the main part portion 24 of the semiconductor module 2 is small.

An end of the positive bus bar 41 is welded to the tip part of the positive terminal 21, and an end of the negative bus bar 23 is welded to the tip part of the negative terminal 23.

This will arrange the positive bus bar 41 arranged on the position more distant than the negative bus bar 43 from the main part portion 24 of the semiconductor module 2.

Others are the same as those of the first embodiment.

In the second embodiment, the direction of the each current i that flows to each of the main part portion 24 of the semiconductor module 2, the positive bus bar 41, the negative bus bar 43, and the intermediate bus bar 42 opposes the neighboring current (refer to the inside of the dashed line circle C in FIG. 5).

Consequently, the inductance of the above-mentioned closed circuit can be reduced reliably.

Further, the second embodiment has the same operation and effect as the first embodiment 1.

Comparative Example

Figure 6:
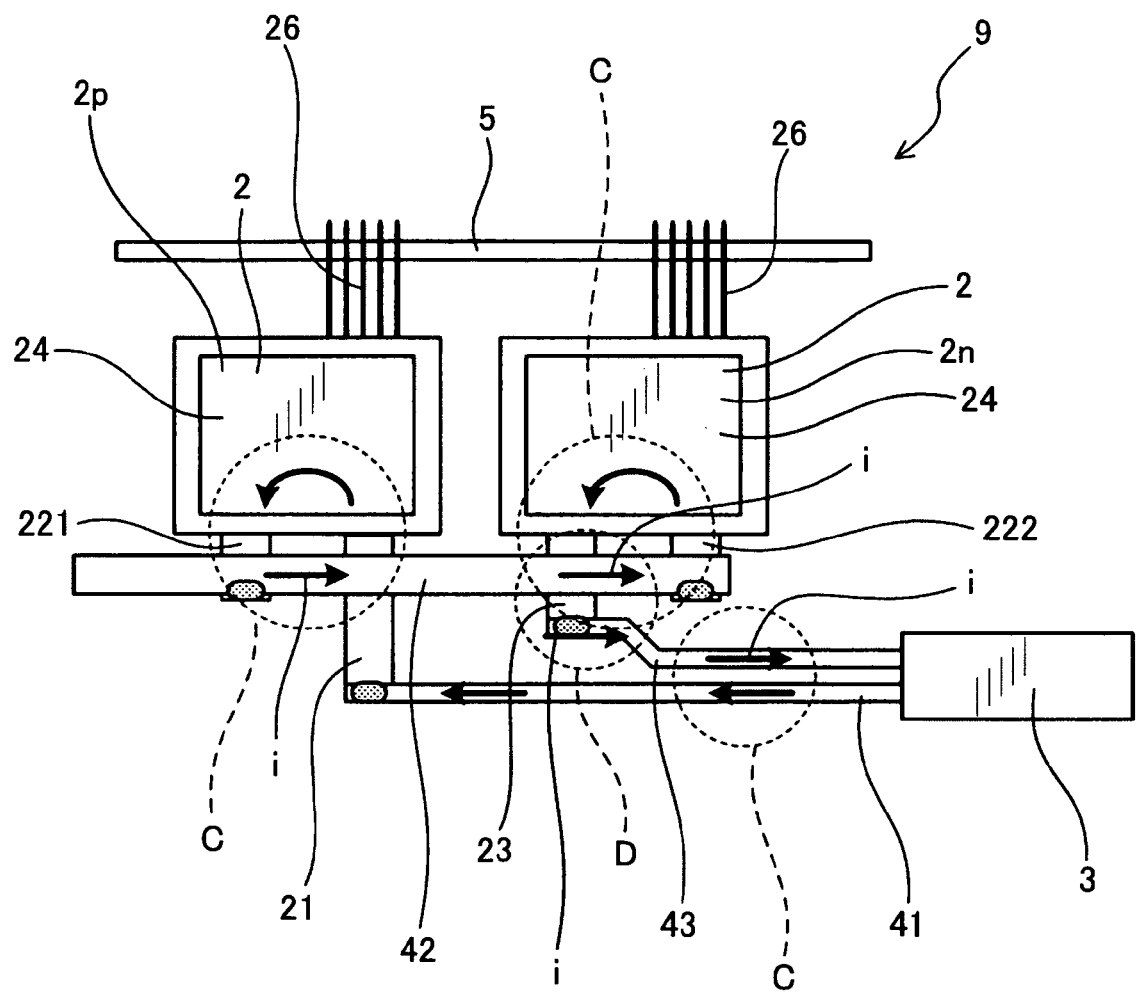
FIG. 6 is a side view showing an electric power converter in a comparative example.

This comparative example shown In FIG. 6 is an example of the power converter 9 that has a portion with the direction of the each current i that flows to each of the main part portion 24 of the semiconductor module 2, the positive bus bar 41, the negative bus bar 43, and the intermediate bus bar 42 is the same with the neighboring current when the closed current flows in the closed circuit (refer to the inside of the dashed line circle D in FIG. 6).

That is, in this example, the intermediate bus bar 42 and the negative bus bar 43 are arranged adjoining each other and in a laminated form, and the direction of the current i that flows to both bus bars becomes the same.

Others are the same as those of the first embodiment.

In this case, the inductance of the circuit will be strengthen by the intermediate bus bar 42 and the negative bus bar 43 with which the current I flows in the same direction.

Thereby, it becomes difficult to fully propose the inductance in the whole closed circuit. Consequently, it becomes easy to generate surge voltage at the time of switching the semiconductor elements.

On the other hand, in the electric power converter 1 of the present invention, when the dosed current flows to the closed circuit like mentioned above, each conductive part is arranged so that the direction of the each current i that flows to each of the main part portion 24 of the semiconductor module 2, the positive bus bar 41, the negative bus bar 43, and the intermediate bus bar 42 opposes the neighboring current.

Therefore, like mentioned above, the inductance of the closed circuit can be reduced and generation of the surge voltage at the time of switching the semiconductor elements can be suppressed.

What is claimed is:

1. An electric power converter comprising:
   a plurality of semiconductor modules having integral semiconductor elements and a capacitor as a power source connected to the semiconductor modules;
   the semiconductor modules include a positive side semiconductor module connected to a positive side of the capacitor and a negative side semiconductor module connected to a negative side of the capacitor;
   the positive side semiconductor module has a positive terminal connected to the capacitor and a 1st intermediate terminal connected to the negative side semiconductor module where both terminals are formed to project from the positive side semiconductor module;
   the negative side semiconductor module has a negative terminal connected to the capacitor and a 2nd intermediate terminal connected to the positive side semiconductor module where both terminals are formed to project from the negative side semiconductor module;
   the positive terminal is connected to the capacitor by a positive bus bar;
   the negative terminal is connected to the capacitor by a negative bus bar;
   the 1st intermediate terminal and the 2nd intermediate terminal are connected with each other by an intermediate bus bar; and
   the positive side semiconductor module, the negative side semiconductor module, the capacitor, the positive bus bar, the negative bus bar, and the intermediate bus bar constitute one closed circuit; wherein;
   a main part of the plurality of semiconductor modules that includes the positive side and negative side semiconductor modules, the positive and negative terminals, and the 1st and the 2nd intermediate terminals, the positive bus bar, the negative bus bar, and the intermediate bus bar are arranged in layered forms so that the direction of each current that flows to each of the main part of the plurality of semiconductor modules, the positive bus bar, the negative bus bar, and the intermediate bus bar opposes a neighboring current when a current flows in the closed circuit;
   the positive side semiconductor module and the negative side semiconductor module are arranged in parallel so that the positive terminal and the negative terminal adjoin each other;
   the capacitor is arranged near the negative side semiconductor module that is the position opposite to the side where the positive side semiconductor module is arranged;

a part of the positive bus bar near the capacitor is arranged closer to the negative bus bar than the intermediate bus bar and a part of the positive bus bar near the positive terminal is arranged closer to the intermediate bus bar than the negative bus bar, the positive bus bar including a bent portion that bends to the negative bus bar side from the intermediate bus bar side in the positive bus bar as the positive bus bar approaches the capacitor; and the intermediate bus bar the positive bus bar and the negative bus bar are arranged parallel in this order and the positive bus bar is sandwiched between the intermediate bus bar and the negative bus bar.

2. An electric power converter, comprising:

a plurality of semiconductor modules having integral semiconductor elements and a capacitor as a power source connected to the semiconductor modules;

the semiconductor modules include a positive side semiconductor module connected to a positive side of the capacitor and a negative side semiconductor module connected to a negative side of the capacitor;

the positive side semiconductor module has a positive terminal connected to the capacitor and a 1st intermediate terminal connected to the negative side semiconductor module where both terminals are formed to project from the positive side semiconductor module;

the negative side semiconductor module has a negative terminal connected to the capacitor and a 2nd intermediate terminal connected to the positive side semiconductor module where both terminals are formed to project from the negative side semiconductor module;

the positive terminal is connected to the capacitor by a positive bus bar;

the negative terminal is connected to the capacitor by a negative bus bar;

the 1st intermediate terminal and the 2nd intermediate terminal are connected with each other by an intermediate bus bar; and the positive side semiconductor module, the negative side semiconductor module, the capacitor, the positive bus bar, the negative bus bar, and the intermediate bus bar constitute one closed circuit; wherein:

a main part of the plurality of semiconductor modules that includes the positive side and negative side semiconductor modules, the positive and negative terminals, and the 1st and the 2nd intermediate terminals, the positive bus bar, the negative bus bar, and the intermediate bus bar are arranged in layered forms so that the direction of each current that flows to each of the main part of the plurality of semiconductor modules, the positive bus bar, the negative bus bar, and the intermediate bus bar opposes a neighboring current when a current flows in the closed circuit;

the positive side semiconductor module and the negative side semiconductor module are arranged in parallel so that the positive terminal and the negative terminal adjoin each other;

the capacitor is arranged in one side of the positive side semiconductor module that is the position opposite to the side where the negative side semiconductor module is arranged; and apart of the negative bus bar near the capacitor is arranged closer to the positive bus bar than the intermediate bus bar and a part of the negative bus bar near the positive terminal is arranged closer to the intermediate bus bar than the negative bus bar, the negative bus bar including a bent portion that bends to the positive bus bar side from the intermediate bus bar side in the negative bus bar as the negative bus bar approaches the capacitor; and the intermediate bus bar, the negative bus bar, and the positive bus bar are arranged parallel in this order and the negative bus bar is sandwiched between the intermediate bus bar and the positive bus bar.

3. An electric power converter comprising:

a capacitor comprising a positive side and a negative side;

a plurality of semiconductor modules, comprising:

a positive side semiconductor module comprising a first plurality of integral semiconductor elements;

a positive terminal extending from the positive side semiconductor module;

a first intermediate terminal extending from the positive side semiconductor module;

a negative side semiconductor module comprising a second plurality of integral semiconductor elements;

a negative terminal extending from the negative side semiconductor module; and a second intermediate terminal extending from the negative side semiconductor module;

a negative bus bar electrically connecting the negative terminal and the negative side of the capacitor;

an intermediate bus bar electrically connecting the first intermediate terminal and the second intermediate terminal; and a positive bus bar electrically connecting the positive side of the capacitor and the positive terminal, the positive bus bar comprising a first portion near the capacitor, a bent portion, and a second portion near the positive terminal, wherein:

the positive side semiconductor module and the negative side semiconductor module are arranged so that the positive terminal is closer to the negative terminal than the second intermediate terminal and the negative terminal is closer to the positive terminal than the first intermediate terminal, the capacitor is arranged closer to the negative side semiconductor module than the positive side semiconductor module, the positive side semiconductor module and the negative side semiconductor module are arranged closer to the intermediate bus bar than the negative bus bar, the positive bus bar is sandwiched between the intermediate bus bar and the negative bus bar, the first portion of the positive bus bar is arranged closer to the negative bus bar than the intermediate bus bar and the second portion of the positive bus bar is arranged closer to the intermediate bus bar than the negative bus bar, the electric power converter comprises a closed circuit wherein a current flows from the positive side of the capacitor through the positive bus bar, the positive side semiconductor module, the intermediate bus bar, the negative side semiconductor module, and the negative bus bar to the negative side of the capacitor, a direction of the current that flows through the positive side semiconductor module is opposite a direction of the current that flows through the intermediate bus bar, a direction of the current that flows through the negative side semiconductor module is opposite a direction of the current that flows through the intermediate bus bar, a direction of the current that flows through the intermediate bus bar is opposite a direction of the current that flows through the positive bus bar, and a direction of the current that flows through the positive bus bar is opposite a direction of the current that flows through the negative bus bar.

4. An electric power converter comprising:

a capacitor comprising a positive side and a negative side;

a plurality of semiconductor modules, comprising:

- a positive side semiconductor module comprising a first plurality of integral semiconductor elements;
- a positive terminal extending from the positive side semiconductor module;
- a first intermediate terminal extending from the positive side semiconductor module;
- a negative side semiconductor module comprising a second plurality of integral semiconductor elements;
- a negative terminal extending from the negative side semiconductor module; and
- a second intermediate terminal extending from the negative side semiconductor module;

an intermediate bus bar electrically connecting the first intermediate terminal and the second intermediate terminal;

a positive bus bar electrically connecting the positive side of the capacitor and the positive terminal; and a negative bus bar electrically connecting the negative terminal and the negative side of the capacitor, the negative bus bar comprising a first portion near the capacitor, a bent portion, and a second portion near the negative terminal, wherein:

the positive side semiconductor module and the negative side semiconductor module are arranged so that the positive terminal is closer to the negative terminal than the second intermediate terminal and the negative terminal is closer to the positive terminal than the first intermediate terminal, the capacitor is arranged closer to the positive side semiconductor module than the negative side semiconductor module, the positive side semiconductor module and the negative side semiconductor module are arranged closer to the intermediate bus bar than the positive bus bar, the negative bus bar is sandwiched between the intermediate bus bar and the positive bus bar, the first portion of the negative bus bar is arranged closer to the positive bus bar than the intermediate bus bar and the second portion of the negative bus bar is arranged closer to the intermediate bus bar than the positive bus bar, the electric power converter comprises a closed circuit wherein a current flows from the positive side of the capacitor through the positive bus bar, the positive side semiconductor module, the intermediate bus bar, the negative side semiconductor module, and the negative bus bar to the negative side of the capacitor, a direction of the current that flows through the positive side semiconductor module is opposite a direction of the current that flows through the intermediate bus bar, a direction of the current that flows through the negative side semiconductor module is opposite a direction of the current that flows through the intermediate bus bar, a direction of the current that flows through the intermediate bus bar is opposite a direction of the current that flows through the negative bus bar, and a direction of the current that flows through the negative bus bar is opposite a direction of the current that flows through the positive bus bar.

\* \* \* \* \*